United States Patent
Hebert et al.

(10) Patent No.: US 6,506,648 B1
(45) Date of Patent: Jan. 14, 2003

(54) METHOD OF FABRICATING A HIGH POWER RF FIELD EFFECT TRANSISTOR WITH REDUCED HOT ELECTRON INJECTION AND RESULTING STRUCTURE

(75) Inventors: Francois Hebert, San Mateo, CA (US); Szehim Daniel Ng, Campbell, CA (US)

(73) Assignee: Cree Microwave, Inc., Sunnyvale, CA (US)

( * ) Notice: Subject to any disclaimer, the term of this patent is extended or adjusted under 35 U.S.C. 154(b) by 298 days.

(21) Appl. No.: 09/145,818

(22) Filed: Sep. 2, 1998

(51) Int. Cl.[7] .................. H01L 21/336; H01L 29/80; H01L 31/112
(52) U.S. Cl. .............. 438/286; 438/289; 438/290; 438/291; 438/305; 438/306; 257/262; 257/288
(58) Field of Search ......................................... 438/286

(56) References Cited

U.S. PATENT DOCUMENTS

| | | | | |
|---|---|---|---|---|
| 5,155,563 A | * | 10/1992 | Davies et al. ............... | 357/23.4 |
| 5,286,995 A | * | 2/1994 | Malhi .......................... | 257/549 |
| 5,306,652 A | * | 4/1994 | Kwon et al. ................. | 438/283 |
| 5,578,860 A | * | 11/1996 | Costa et al. ................. | 257/528 |
| 5,696,010 A | * | 12/1997 | Malhi .......................... | 438/279 |
| 5,869,875 A | * | 2/1999 | Hebert et al. ................ | 257/382 |
| 5,912,490 A | * | 6/1999 | Hebert et al. ................ | 257/340 |
| 5,918,137 A | * | 6/1999 | Ng et al. ...................... | 438/454 |

* cited by examiner

*Primary Examiner*—John R. Lee
*Assistant Examiner*—Bernard Souw
(74) *Attorney, Agent, or Firm*—Townsend and Townsend and Crew LLP; Henry K. Woodward

(57) ABSTRACT

Methods of fabricating a high power RF lateral diffused MOS transistor (LDMOS) having increased reliability includes fabricating an N-drift region for the drain prior to fabrication of the gate contact and other process steps in fabricating the transistor. The resulting device has reduced adverse affects from hot carrier injection including reduced threshold voltage shift over time and reduced maximum current reduction over time. Linearity of device is maximized along with increased reliability while channel length is reduced.

18 Claims, 15 Drawing Sheets

- FINAL DRIVE
- PASSIVATION: DEPOSITION OF DOPED GLASS (NITRIDE/OXIDE, BPSG, PSG, ETC.) WITH OPTIONAL REFLOW FOR PLANARIZATION PRIOR TO METALIZATION
- CONTACT MASK AND ETCH (TO EXPOSE SOURCE, GATE AND DRAIN CONTACTS)
- METAL DEPOSITION (Al, Al/1%Si/0.5%Cu, Al WITH TiW BARRIER, TiW/Au, ETC.)
- METAL MASK AND ETCH FOLLOWED BY FINAL PASSIVATION AND BOND PAD PATTERNING

- STANDARD FIELD OXIDATION
- LPCVD NITRIDE STRIP
- BLANKET N-WELL IMPLANT THROUGH SCREEN OXIDE. (As OR PHOSPHORUS, ENERGY 40 TO 200 KeV, DOSE 1E12 TO 1E13)
- OPTIONAL DEEP SINKER FOR GROUNDED SOURCE LDMOS DEVICE

- OPTIONAL SACRIFICAL OXIDE (ALSO USED FOR IMPLANT SCREEN OXIDE)
- DEEP P+ IMPLANTS (TYPICALLY USED TO LOWER BETA OF PARASITIC NPN DEVICE)
- GATE OXIDATION (100 TO 1000A TYPICAL, 500–700A PREFERRED)
- GATE DEPOSITION (POLYSILICON, 1000–6000A THICK, OR POLYCIDE: 1000–4000A POLYSILICON WITH SILICIDE ON TOP, WSix FOR EXAMPLE, 1000–4000A THICK)
- GATE PATTERNING AND ETCH

- CHANNEL MASK AND BORON IMPLANT (B11 OR BF2, 20–150KeV, 1E12–1E15 DOSE)
- CHANNEL DRIVE (950–1200C, 60–800 MINUTES)

- N+ SOURCE AND DRAIN CONTACT MASK AND N+ IMPLANT (Phos OR As, 30–180 KeV, 1E15 TO 2E16 DOSE)
- FINAL DRIVE-IN AND ACTIVATION OF DOPANTS
- DIELECTRIC DEPOSITION (OXIDE, PSG OR BPSG OXIDE)
- OPTIONAL REFLOW, ANNEAL OR DENSIFICATION OF DEPOSITED DIELECTRIC

- CONTACT MASK (N+ SOURCE AND DRAIN AND GATE) AND ETCH TO Si
- METALIZATION (GATE METAL AND CONTACT AT THE END OF THE GATE FINGERS)

- STARTING MATERIAL EITHER P- ON P+
- THIN SCREEN OXIDATION (TO MINIMIZE N-DRIDFT DOPANT OXIDATION), 150-500A
- OPTIONAL N-DRIFT REGION MASK
- N-WELL IMPLANT (As 40-160 KeV, 1E11 TO 5E13 DOSE). DOSE DEPENDS ON TARGET BVdss.

- DEEP P+ SINKER MASK
- DEEP P+ SINKER IMPLANT (BORON OR BF2, >5E15 DOSE) (FOR SOURCE GROUNDING BY FORMING A TOP-SIDE GROUND
- LPCVD NITRIDE DEPOSITION
- ACTIVE AREA MASK (ETCH NITRIDE WHERE FIELD OXIDE WILL BE PRESENT)
- SINKER DRIVE (1000–1270C, 60' TO 800') AND FIELD OXIDE (0.5 TO 3 um THICK) GROWTH

- NITRIDE STRIP AND THICK OXIDE GROWTH (TO REDUCE GATE TO DRAIN CAPACITANCE) OF 0.3–1.0 um
- PATTERN THE OXIDE ON ACTIVE AREA (ETCH OXIDE WHERE CONTACTS FOR SINKER, SOURCE AND DRAIN WILL BE MADE, AND WHERE CHANNEL WILL BE FORMED
- OPTIONAL SCREEN OXIDE GROWTH
- DEEP P+ MASK AND BORON IMPLANT (BORON OR BF2, 4E14–6E15), TYPICALLY USED TO ELIMINATE THE PARASITIC BIPOLAR TRANSISTOR

- SCREEN OX STRIP, WAFER CLEANING,
- GATE OXIDATION (100 TO 1000A) AND POLYSILICON DEPOSITION (0.1 TO 0.6 um),
- OPTIONAL SILICIDE FORMATION OR DEPOSITION
- GATE DOPING (N-TYPE, PHOSPHORUS OR ARSENIC)
- GATE MASK AND
- POLYSILICON OR POLYCIDE ETCH (GATE PATTERNING)

- CHANNEL MASK (EXPOSES REGION WHERE CHANNEL WILL BE FORMED)
- CHANNEL DOPING (BORON OR BF2, DOSE 1E13 TO 5E14)
- CHANNEL DRIVE TO DIFFUSE CHANNEL IMPLANT LATERALLY UNDER GATE (950 TO 1150C, 60 MIN TO 800 MIN) WITH JUNCTION DEPTH DEPENDING ON BREAKDOWN VOLTAGE REQUIREMENT AND CHANNEL LENGTH (PREFERRED 0.5 TO 1.5 um)
- N+ DOPING MASK TO DOPE SOURCE AND DRAIN CONTACTS
- N+ DOPING (As OR PHOSPHOROUS, 1E15 TO 1E16 DOSE)

- FINAL DRIVE
- PASSIVATION: DEPOSITION OF DOPED GLASS (NITRIDE/OXIDE, BPSG, PSG, ETC.) WITH OPTIONAL REFLOW FOR PLANARIZATION PRIOR TO METALIZATION
- CONTACT MASK AND ETCH (TO EXPOSE SOURCE, GATE AND DRAIN CONTACTS)
- METAL DEPOSITION (Al, Al/1%Si/0.5%Cu, Al WITH TiW BARRIER, TiW/Au, ETC.)
- METAL MASK AND ETCH FOLLOWED BY FINAL PASSIVATION AND BOND PAD PATTERNING

- REMOVE THICK OXIDE FROM ACTIVE AREA OF DEVICE
- OPTIONAL SCREEN OXIDE GROWTH, DEEP P+ MASK AND IMPLANT
- SCREEN OX STRIP, WAFER CLEANING, GATE OXIDATION (100 TO 1000A)
- POLYSILICON DEP (1000–5000A) AND DOPING (POCl3 OR As/PHOS IMPLANT)
- SILICIDE DEPOSITION (WSix, THICK 1000–4000A)
- GATE MASK AND POLYCIDE ETCH

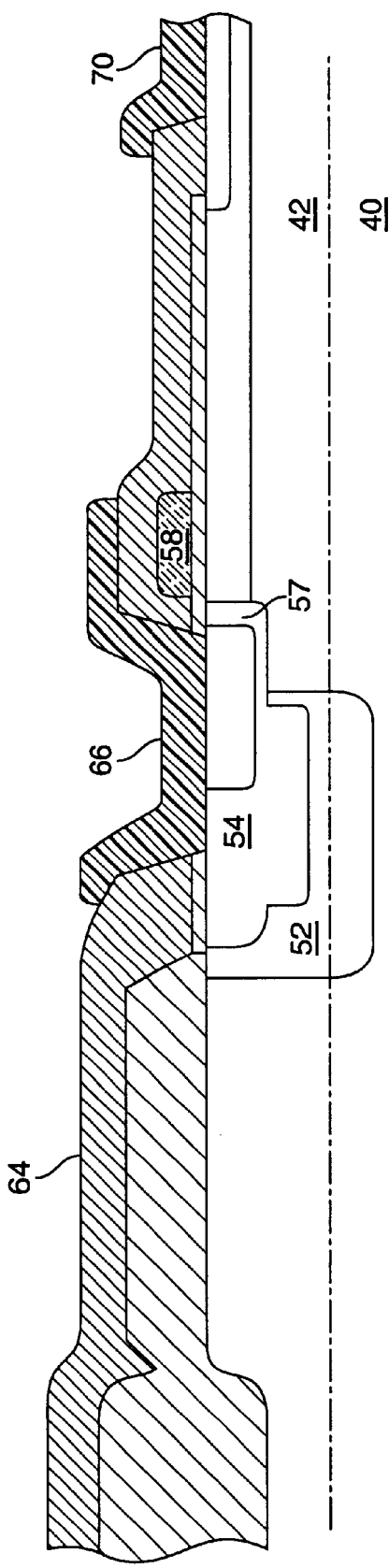

- CHANNEL MASK AND IMPLANT, CHANNEL DRIVE, FINAL DRIVE
- PASSIVATION: DEPOSITION OF DOPED GLASS (NITRIDE/OXIDE, BPSG, PSG, ETC.) WITH OPTIONAL REFLOW FOR PLANARIZATION PRIOR TO METALIZATION
- CONTACT MASK AND ETCH (TO EXPOSE SOURCE, GATE AND DRAIN CONTACTS)
- METAL DEPOSITION (Al, Al/1%Si/0.5%Cu, Al WITH TiW BARRIER, TiW/Au, ETC.)
- METAL MASK AND ETCH FOLLOWED BY FINAL PASSIVATION AND BOND PAD PATTERNING

FIG. 4B

METHOD OF FABRICATING A HIGH POWER RF FIELD EFFECT TRANSISTOR WITH REDUCED HOT ELECTRON INJECTION AND RESULTING STRUCTURE

BACKGROUND OF THE INVENTION

This invention relates generally to high power RF field effect transistors, and more particularly the invention relates to a method of fabrication and resulting structure with reduced hot electron injection and improved device operating characteristics.

Hot carrier injection (HCI) is a phenomena which reduces the reliability and affects the performance over time of metal insulator semiconductor field effect transistors (MISFET) and in particular the lateral diffused MOSFET (LDMOS) devices. HCI is a result of high peak electric field and impact ionization in the drain of MOSFET devices. For high power RF applications, power supply voltage, Vdd is typically well in excess of 25 volts. Higher voltage means higher electric field. For RF applications at frequencies above 1 GHz, short channel (gate length $<1\mu$) MOSFETs are used to minimize capacitances. The high Vdd results at high electric field and significant impact ionization or hot electrons. The hot electrons are injected into the gate oxide impacts the threshold voltage, Vth, and the transconductance, $G_m$, compression behavior.

Typically, the drain doping is maximized in order to minimize the on-resistance, Rdson, of a MOSFET. Higher doping results in higher electric fields and higher carrier generation rates, which results in hot carrier injection into the gate dielectric. The hot electrons injected into the gate oxide near the drain of the MOSFET tends to shift some of the key transistor parameters over time. For example, a typical RF power LDMOS device has a positive shift in $V_{gs}$ arising from HCI. This translates into a negative drain current shift of minus 3.5%/decade-time (nominal value of drain current of 200 mA), and also results in a reduction in the maximum drain current for linear operation of approximately 20% over 15 hours of operation. This is illustrated in the curve of FIG. 1 in which transconductance is plotted versus drain current before and after stress.

Davies et al. U.S. Pat. No. 5,155,563 discloses an LDMOS structure with an extended drain which is formed after gate patterning and which is designed to reduce HCI. The N-extended drain is self-aligned to the gate edge in order to minimize the gate to drain capacitance. As the N-extended drain dopant level is increased to reduce drain resistance, surface doping increases which increases peak electric field and impact ionization generation. Further, channel length is not minimized since N dopant diffusion under the gate is not impeded since the N-drain is not present during the channel drive.

Another device to reduce HCI is the low doped drain (LDD) MOSFET transistor which introduces a low doped drain (N−) under the gate and next to the drain contact. However, these devices can only be operated at low voltages since there is insufficient drain drift region to sustain high voltages.

Thus increasing the N-drain region doping results in excessive HCI, which reduces the reliability and stability of the devices over time. However, N-drain doping should be increased in order to improve linearity at high power levels (peak current) and reduce on-resistance of the device. However, N-drain doping cannot be maximized with prior art structures due to hot carrier injection problems.

SUMMARY OF THE INVENTION

In accordance with the invention, a fabrication process for a LDMOS device is provided in which an N-well for the drain drift region is formed prior to gate fabrication. This optimizes the doping profile of the N-drain region and the channel region of the resulting structure. RF performance of the device can be improved while reducing HCI related shifts in threshold voltage (Vth) over time and minimizing reduction in maximum device current over time.

The N-well can be formed at the beginning of the process using an optional mask. However, there is no need for complex processing such as the need for spacers in forming LDD devices. The N-well can be blanket doped or masked doped. The resulting structure can have a 50% reduction in impact ionization generation resulting in reduced HCI. Linearity of the device can be maximized without reducing reliability. Further, channel length is reduced.

The invention and objects and features thereof will be more readily apparent from the following detailed description and appended claims when taken with the drawings.

BRIEF DESCRIPTION OF THE DRAWINGS

FIGS. 4A–4B are section views illustrating steps in fabricating a LDMOS device in accordance with another embodiment of the invention.

DETAILED DESCRIPTION OF ILLUSTRATIVE EMBODIMENTS

Figure 1:
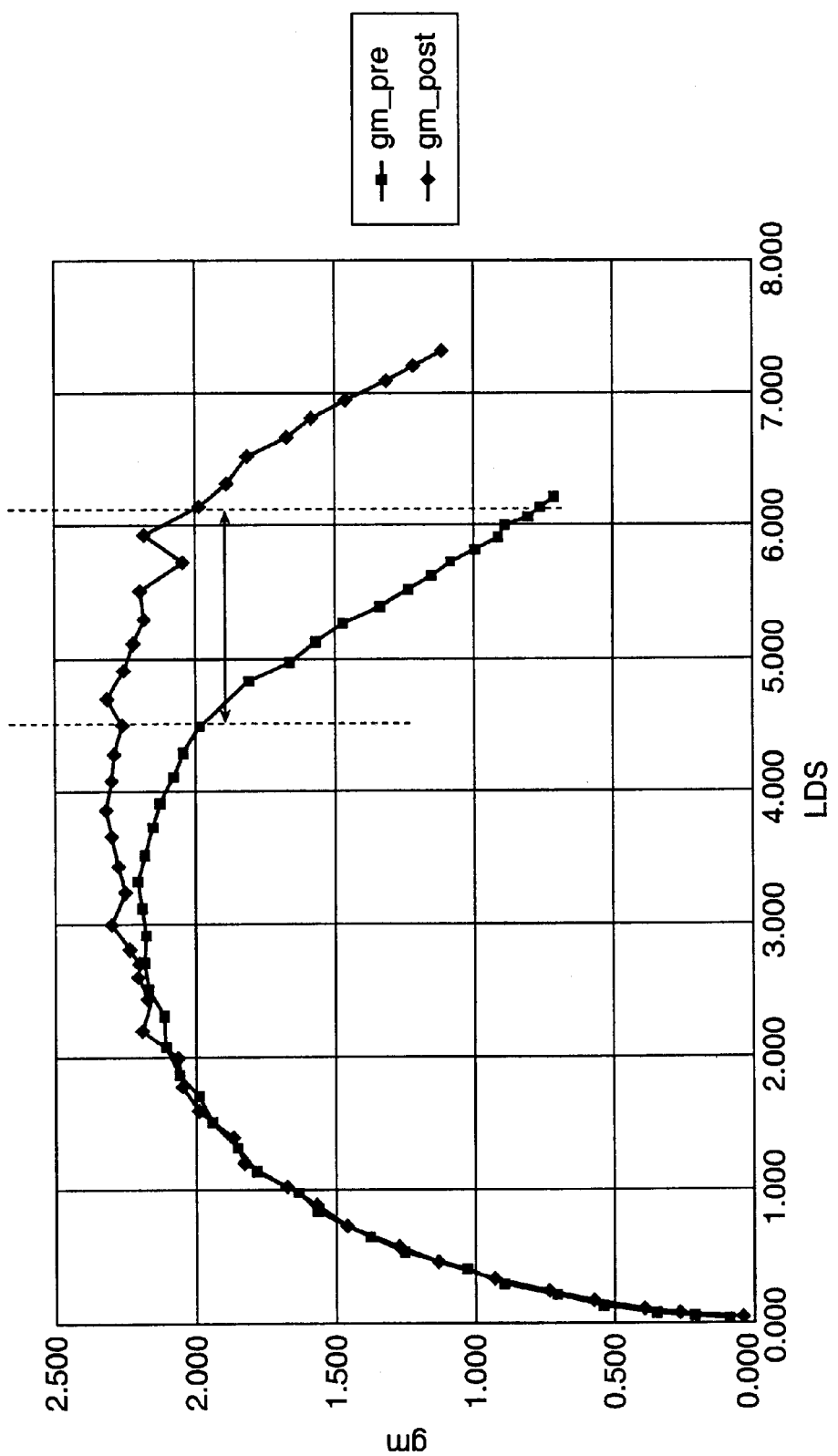
FIG. 1 is a plot of transconductance versus drain-source current before and after a 15 hour stress time for a prior art device.
Figure 2A:
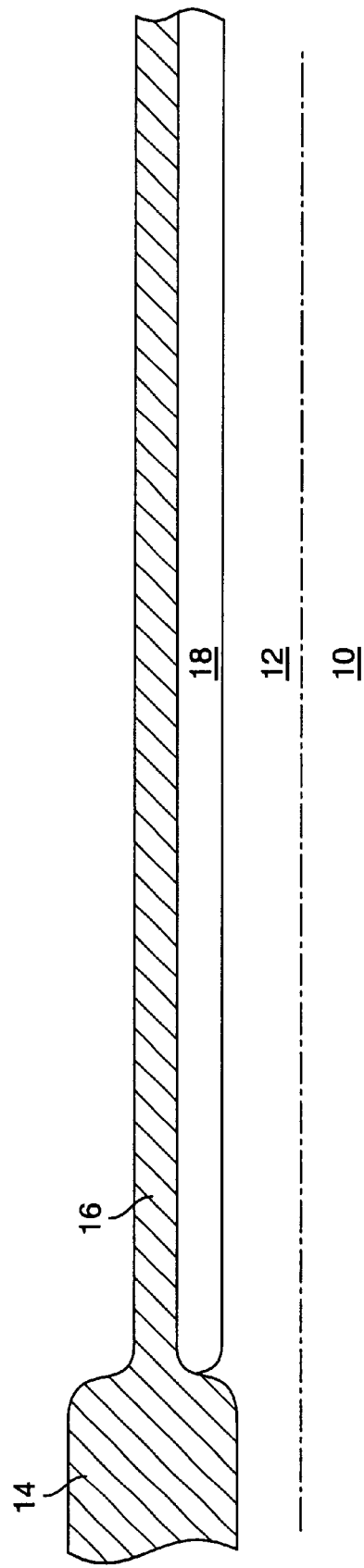
FIGS. 2A–2E are section views illustrating the fabrication of an LDMOS device in accordance with one embodiment of the invention.

Referring to the drawings, FIGS. 2A–2E are section views illustrating steps in fabricating a LDMOS device in accordance with one embodiment of the invention. In FIG. 2A a P+ substrate 10 has a P− epitaxial layer 12 on one surface and a standard field oxidation forms field oxide 14 in the surface of the epitaxial layer using a nitride mask to protect the active device region. The nitride is then stripped and a screen oxide 16 is formed over the surface of the active region of the device. A blanket N-well implant is then formed through the screen oxide to form N-well 18. The implant is either arsenic or phosphorus with an energy 40 to 200 KeV, with a dose at 1E12 to 1E13. An optional deep P+ sinker for a grounded LDMOS device can be formed at this step.

Figure 2B:
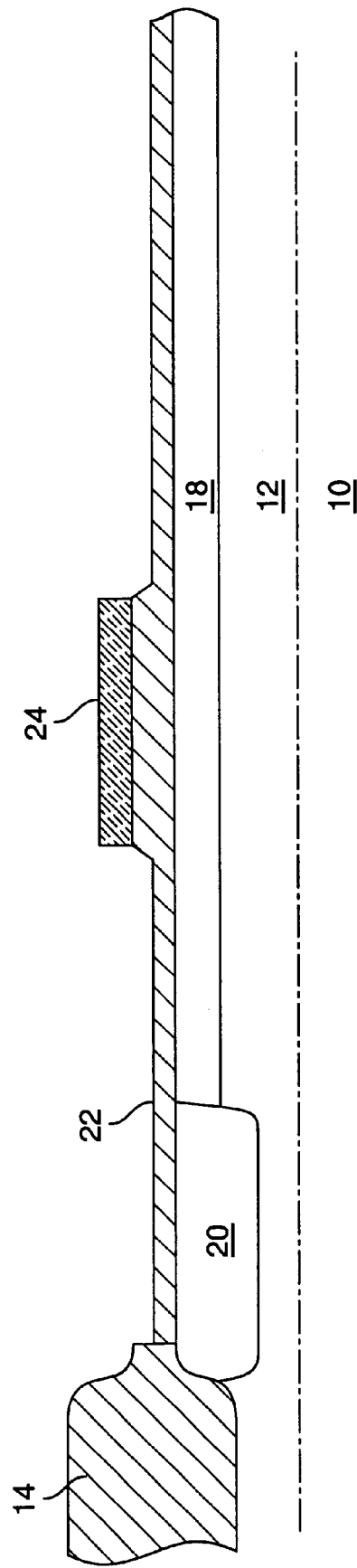

In FIG. 2B a deep P+ implant 20 is made to lower the beta of a parasitic NPN device and then the implant screen oxide is removed and gate oxide 22 is grown (100–1000 Å typical, 500–700 Å preferred). A conductive material (polysilicon 1000–6000 Å thick or polycide: 1000–4000 Å, or polysilicon with silicide on top, 1000–4000 Å thick) is deposited on the gate oxide 22. The gate is then patterned and the deposited conductive material etched forming gate 24.

Figure 2C:
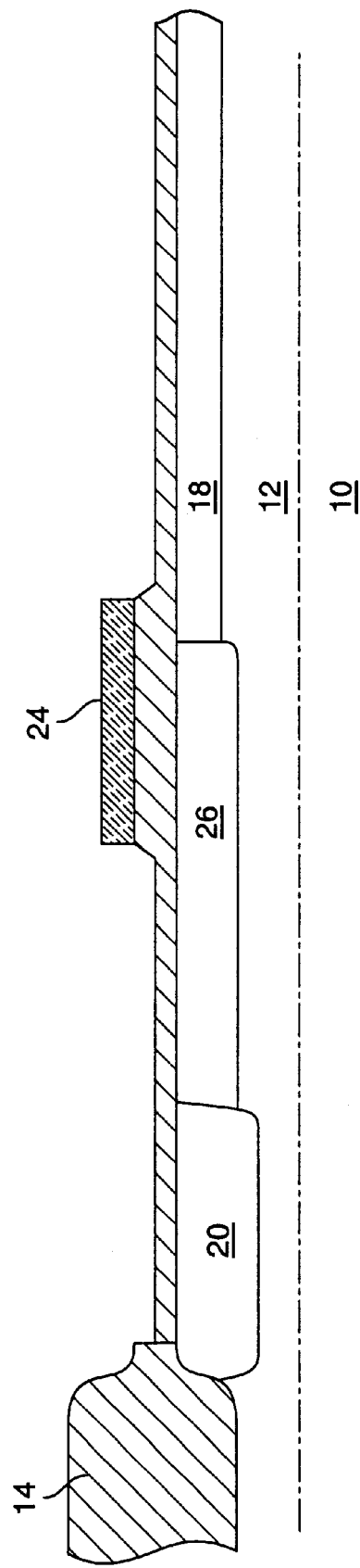

In FIG. 2C a channel mask and boron implant (B11 or BF2, 20–150 KeV, 1E12–1E15 dose) and a following channel drive (950–1200° C., 60–800 minutes) forms the P-channel region 26 under gate 24.

Figure 2D:
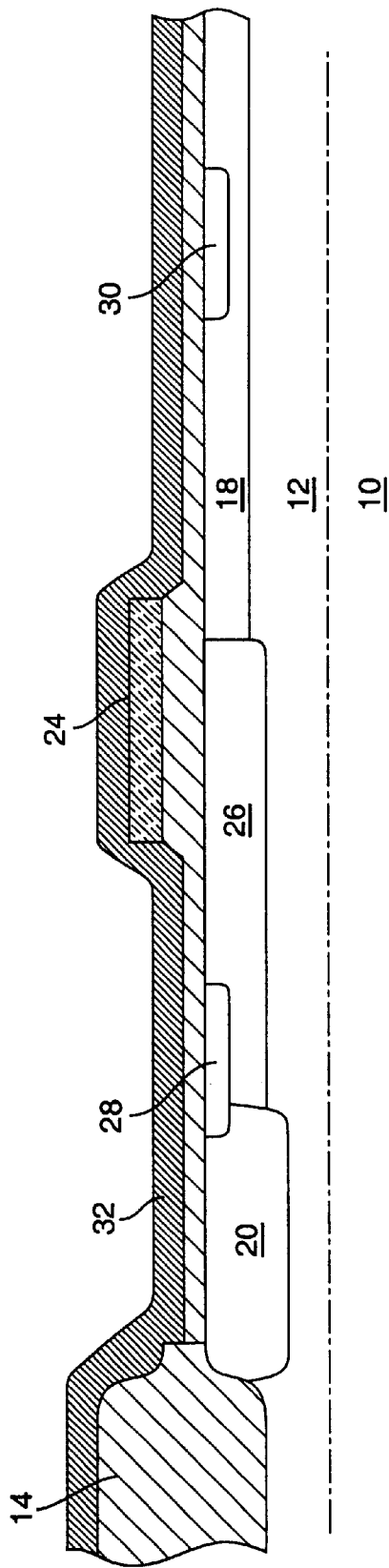

In FIG. 2D N+ source and drain contact mask and N+ implant (Phosphorus or Arsenic, 30–180 KeV, 1E15 to 2E16 dose) forms the N+ source contact 28 and N+ drain contact 30. A final drive-in and activation of dopants is followed by dielectric deposition (oxide, PSG or BPSG oxide) which forms dielectric layer 32 over the surface of the device. An optional reflow, anneal or densification of the deposited dielectric can be employed.

Figure 2E:
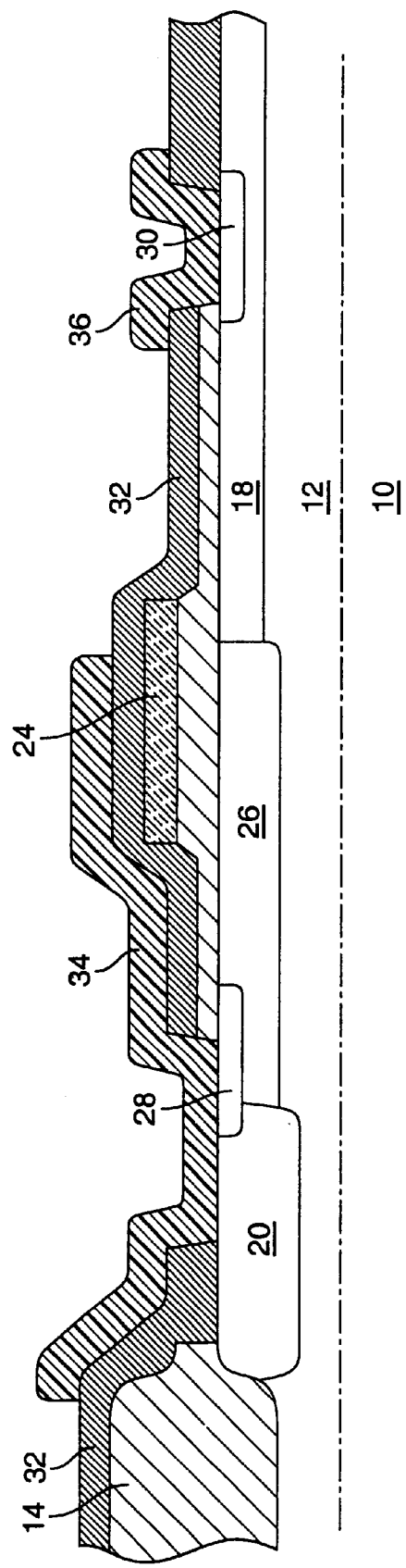

The final device is illustrated in FIG. 2E. A contact mask and etch is used to expose the N+source 28 and N+drain 30 and a contact region to gate 24 (not shown), and then metalization is deposited and etched to form metal source contact 34, metal drain contact 36 and a metal gate contact (not shown). The gate contact will be at the end of the gate finger. Advantageously, the N-well 18 of the drain is more uniformly doped, and the length of the channel region 26 under gate 24 is minimized due to doping compensation.

FIGS. 3A–3F are section views illustrating steps in fabricating a LDMOS in accordance with another embodiment of the invention. Again, a P+silicon substrate 40 has a P-epitaxial layer 42 on one surface with a field oxide 44 formed around the device region. Rather than using a blanket diffusion in forming the N-drift region, a mask is employed to limit the N-drift region. N-drift region 46 is formed by an N-well implant (Arsenic 40–160 KeV, 1E11 to 5E13 dose) through screen oxide 48 and a nitride layer 50.

Figure 3A:
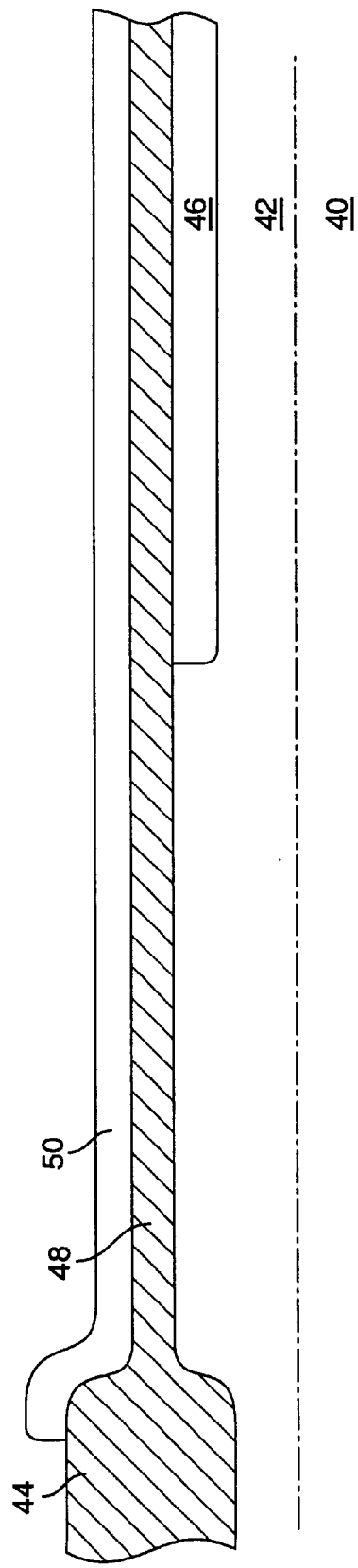
FIGS. 3A–3F are section views illustrating steps in fabricating a LDMOS device in accordance with another embodiment of the invention.
Figure 3B:
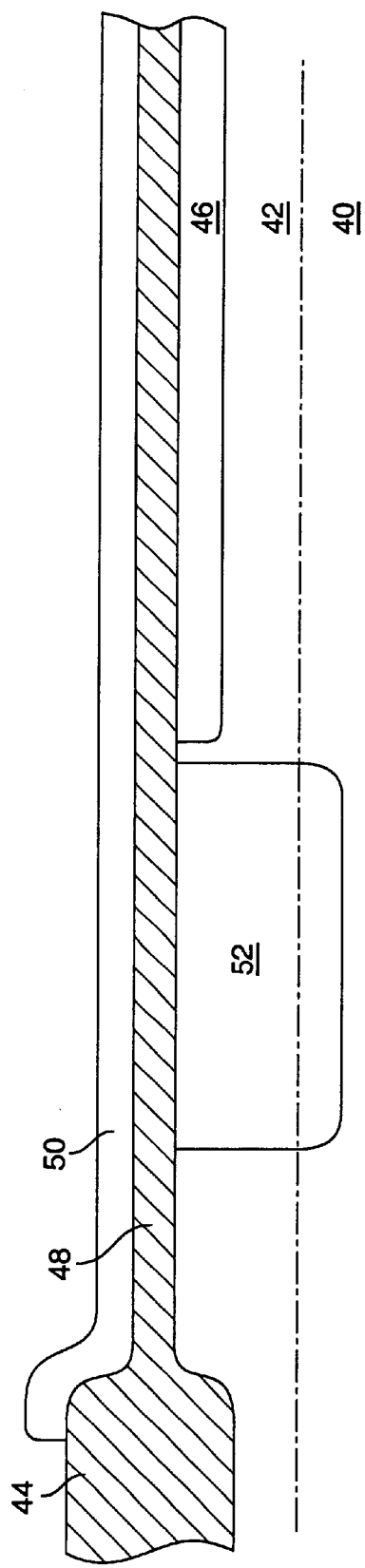

In FIG. 3B P+ sinker 52 is formed by mask and implant (boron or BF2, >5E15 dose) with the sinker providing source grounding with a top side ground contact. The sinker drive is 1000–1270° C., for 60 minutes to 800 minutes. A nitride layer of 500–2,000 Å is deposited and patterned over the active area. A field oxide of 0.5–3.0µ in thickness is then grown.

Figure 3C:
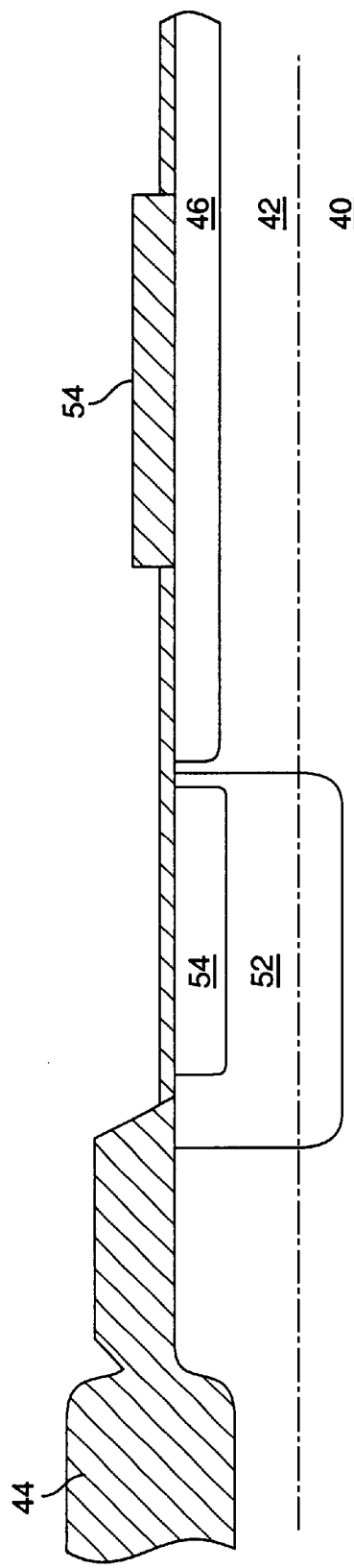

In FIG. 3C the nitride layer 50 is stripped and a thick oxide growth forms bump oxide 54 of 0.3–1.0µ which reduces gate to drain capacitance. The oxide is patterned on the active area, and the oxide is etched where contacts for sinker, source, and drain will be made, and where the channel will be formed. The deep P+ mask and boron implant (Boron or BF2, 4E14–6E15) is typically used to eliminate the parasitic bipolar transistor.

Figure 3D:
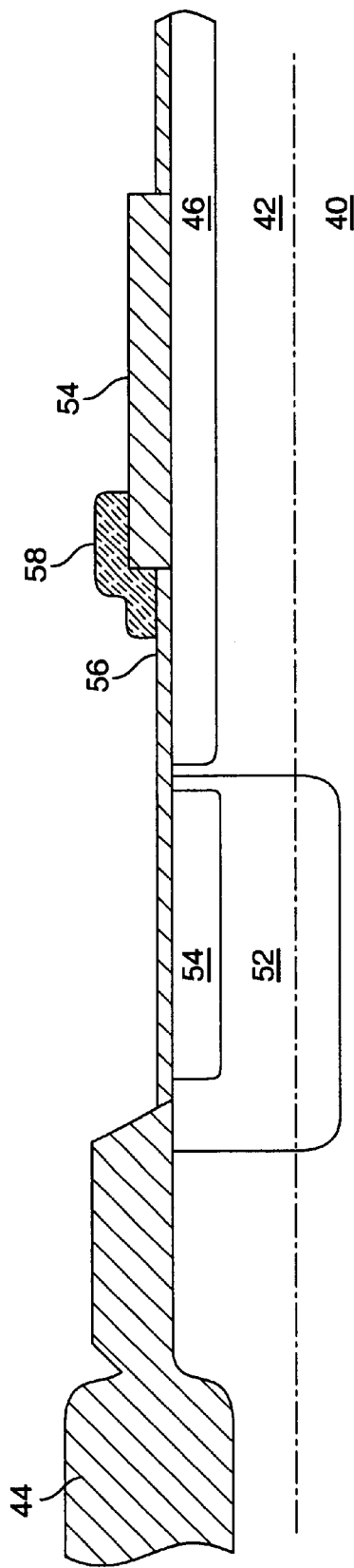

In FIG. 3D the screen oxide is stripped and the wafer cleaned. Thereafter gate oxidation (100 to 1000 Å) and polysilicon deposition (0.1 to 0.6µ) provide the gate oxide 56 and gate 58. The polysilicon material is then doped (N-type, phosphorus or arsenic), the gate is masked and then etched (gate patterning) to form gate 58. Part of gate 58 is formed over the bump oxide.

Figure 3E:
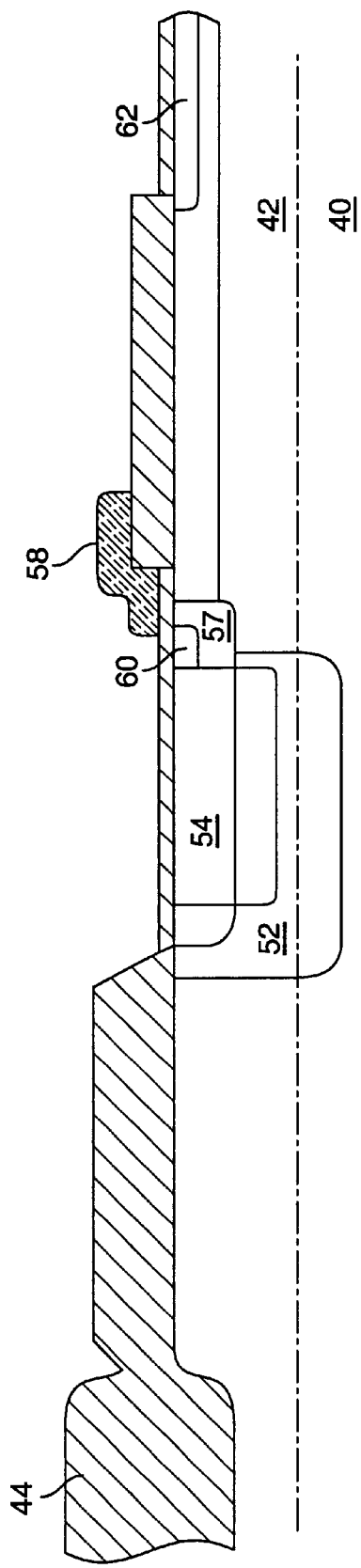

In FIG. 3E a channel mask exposes the region where the channel is to be formed and then channel doping (Boron or BF2, dose 1E13 to 5E14) is implemented. A channel drive then diffuses the channel implant laterally under the date (950 to 1150° C., 60 min to 800 min) with junction depth depending on breakdown voltage requirement and channel length (preferred 0.5 to 1.5µ). An N+ doping mask for doping the source and a drain contacts is followed by the doping of arsenic or phosphorus, 1E15 to 1E16 dose to form source region 60 N+ drain region 62.

Figure 3F:
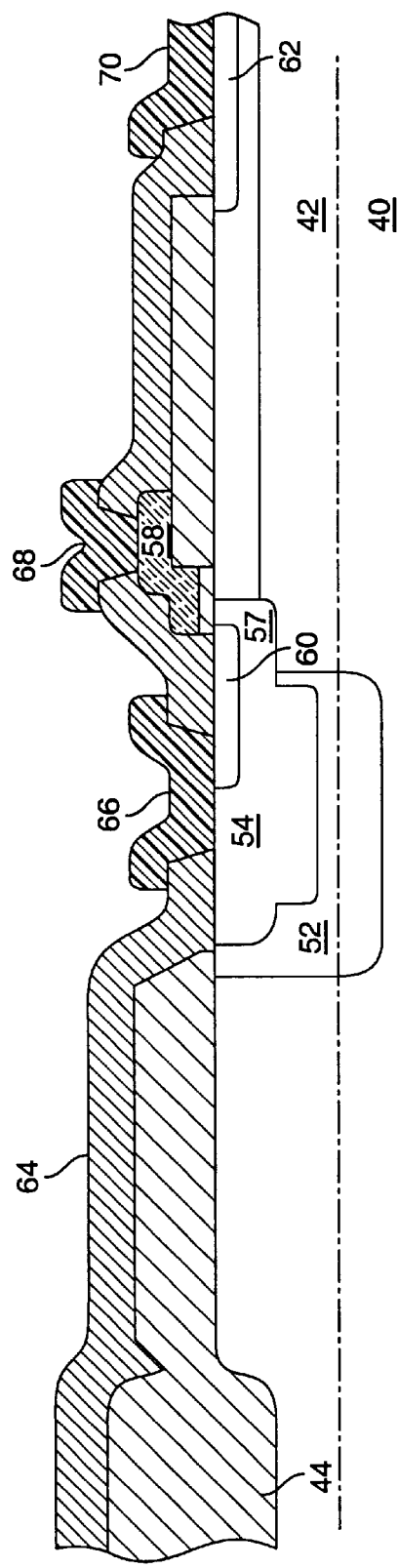

The final device is illustrated in FIG. 3F which results after a final drive of the dopant. A passivation layer 64 is formed by deposition of doped glass (nitride/oxide, BPSG, PSG) with optional reflow for planarization prior to metalization. The contact mask and etch exposes the source, gate and drain contacts, and then metal deposition (Al, Al/1%Si/ 0.5%Cu, Au with TiW barrier) followed by metal mask and etch forms the source metal contact 66, gate metal contact 68, and drain metal contact 70.

Figure 4A:
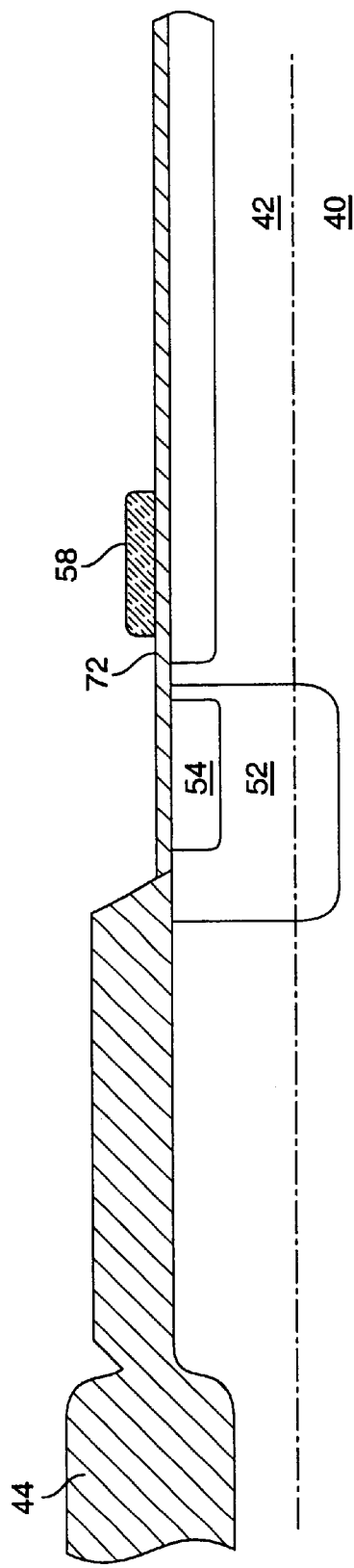

FIGS. 4A and 4B illustrate section views of an alternative in the process of FIGS. 3A–3F. The process is the same as described for FIGS. 3A–3C up to and including thick oxide growth over the active area. As shown in FIG. 4A the thick oxide is removed from the active area of the device and the deep P+ mask implant 54 is implemented. The screen oxide is stripped and gate oxide (100 to 1000 Å) 72 is grown. Polysilicon deposition (1000–5000 Å) and doping (POCl3 or As/Phos implant) dopes the deposited polysilicon gate 58. A silicide deposition (WSix, thickness 1000–4000 Å) can then be formed on the surface of gate 58. A gate mask and polycide etch then forms the final gate 58.

In FIG. 4B the finished device is illustrated. A channel mask and implant and channel drive forms channel region 57 and then passivation layer 64 is formed by deposition of doped glass (nitride/oxide, BPSG, PSG) with optional reflow for planarization prior to metalization. A contact mask and etch then exposes source, gate and drain contacts, metal is deposited (Al, Al/1%Si/0.5%Cu, Au with TiW barrier) and then a metal mask and etch forms source metal contact 66 and drain metal contact 70. A gate contact (not shown) is on the extended finger of gate 58.

Figure 5:
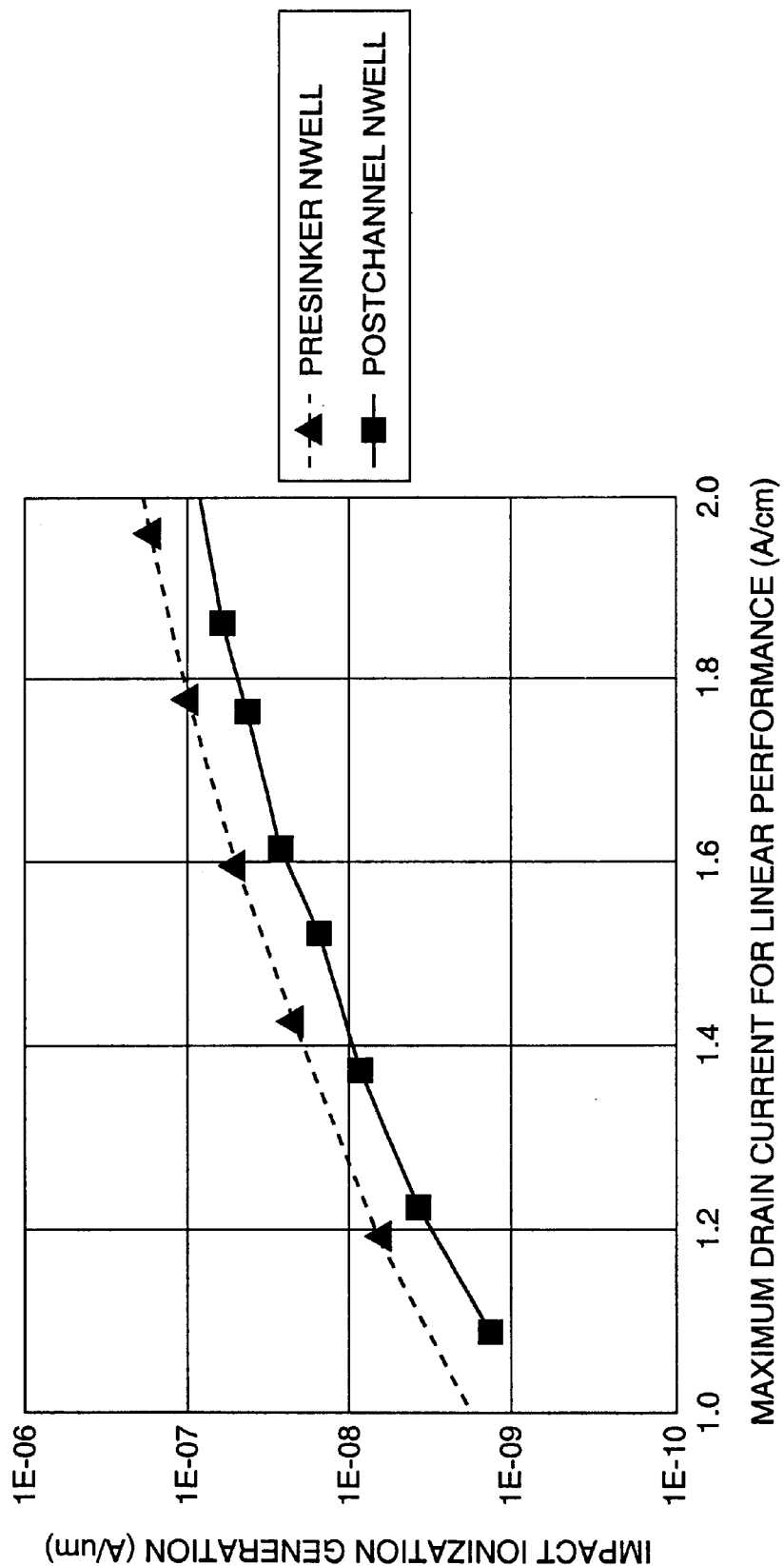
FIG. 5 is a plot of impact ionization generation (A/$\mu$) versus maximum drive current for linear performance (A/cm) of prior art devices and devices fabricated in accordance with the present invention.

FIG. 5 illustrates the generation current under the gate for the N-drift region formed before the sinker versus after channel formation as in the prior art. It is noted that the impact ionization generation is uniformly reduced versus maximum drain current for linear performance for the presinker N-well in accordance with an embodiment of the invention. The length of the channel region under the gate is minimized due to doping compensation in accordance with the invention, and the new structure in accordance with the invention has less shift in threshold voltage over time and less transconductance shift at high current over time.

While the invention has been described with reference to several embodiments, the description is illustrative of the invention and is not to be construed as limiting the invention. Various modifications and applications may occur to those skilled in the art without departing from the true spirit and scope of the invention as defined by the appended claims.

What is claimed is:

1. A method of fabricating a high power RF lateral diffused MOS transistor (LDMOS) with increased reliability comprising the steps of:
   a) providing a substrate of one conductivity type having a major surface,
   b) forming a doped well of second conductivity type in the major surface, said doped well forming a lightly doped drain drift region for the LDMOS drain,
   c) forming a field oxide in the major surface around a device region,
   d) after step b forming a gate oxide on the major surface and over the doped well,
   e) after step d forming a gate on the gate oxide over a portion of doped well,
   f) forming a channel region of the first conductivity type extending under the gate by dopant implant and thermal drive-in, and
   g) forming a source region of second conductivity type in the channel region and aligned with the gate and a drain region in the doped well spaced from the gate.

2. The method as defined by claim 1 wherein the substrate includes an epitaxial layer of first conductivity type on the major surface.

3. The method as defined by claim 2 and further including the step of:

h) forming contacts to the source region, drain region and the gate.

4. The method as defined by claim 2 wherein step b) includes a blanket implant of dopant of second conductivity type.

5. The method as defined by claim 2 wherein step b) includes a mask to limit the doped well within the device region.

6. The method as defined by claim 2 and further including after step b) the step of forming a deep implant of dopant of first conductivity type for use in decreasing the effect of a parasitic bipolar transistor.

7. The method as defined by claim 6 wherein the deep implant provides a ground contact on the major surface.

8. The method as defined by claim 2 wherein the first conductivity type is P type and the second conductivity type is N type.

9. The method as defined by claim 2 wherein step d) forms a gate oxide of at least two thicknesses whereby step e) forms a gate over a thinner oxide over the channel region and over a thicker oxide over the doped well adjacent to the channel region to reduce gate-drain capacitance.

10. The method as defined by claim 2 wherein step e) forms a gate from material selected from the group consisting of doped polysilicon and polycide.

11. The method as defined by claim 2 and further including the steps of h) forming a passivation layer over the surface of the device region, and i) forming contacts to the source region, the drain region, and the gate.

12. The method as defined by claim 11 wherein the passivation layer is selected from the group consisting of silicon oxide, PSG glass, BPSG oxide, and silicon nitride.

13. The method as defined by claim 11 wherein the contacts are selected from the group consisting of aluminum, aluminum/1% silicon/0.5% copper, and gold with a refractory metal barrier.

14. The method as defined by claim 1 and further including the step of performing a sinker drive to diffuse a sinker region and reduce the surface dopant concentration of the doped well.

15. A LDMOS transistor fabricated from the process defined by claim 1.

16. A LDMOS transistor fabricated from the process defined by claim 2.

17. A LDMOS transistor fabricated from the process defined by claim 3.

18. A LDMOS transistor fabricated from the process defined by claim 11.

* * * * *